(12) United States Patent
Kitani

(10) Patent No.: US 6,424,042 B1
(45) Date of Patent: Jul. 23, 2002

(54) SEMICONDUCTOR DEVICE AND MANUFACTURING METHOD THEREOF

(75) Inventor: Takeshi Kitani, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/505,990

(22) Filed: Feb. 17, 2000

(30) Foreign Application Priority Data

Jul. 28, 1999 (JP) .............................. 11-214361

(51) Int. Cl.⁷ .............................................. H01L 23/98
(52) U.S. Cl. ..................... 257/752; 257/758; 257/760
(58) Field of Search ............................. 257/752, 758, 257/760; 438/620, 622, 624

(56) References Cited

U.S. PATENT DOCUMENTS

| | | | | |
|---|---|---|---|---|
| 5,381,046 A | * | 1/1995 | Cederbaum et al. | ........ 257/760 |
| 5,926,732 A | * | 7/1999 | Matsuura | .................... 438/622 |
| 6,010,955 A | * | 1/2000 | Hashimoto | .................. 438/597 |
| 6,225,211 B1 | * | 5/2001 | Tsui | ........................... 438/624 |

FOREIGN PATENT DOCUMENTS

| | | |
|---|---|---|
| JP | 7-240466 | 9/1995 |
| JP | 8-222630 | 8/1996 |
| JP | 10-284492 | 10/1998 |
| JP | 10-321623 | 12/1998 |

* cited by examiner

*Primary Examiner*—T. N. Quach
(74) *Attorney, Agent, or Firm*—McDermott, Will & Emery

(57) ABSTRACT

An interlayer film layer is formed on an (N−1)-th interconnection Layer via a barrier film, and an N-th interconnection layer is formed on the interlayer film layer. An interconnection having a Damascene structure is formed in the interconnection layer and the interlayer film layer. The interconnection has an wiring portion having a narrow line width and a pad portion having a wide line width. A recess corresponding to the wiring portion and the pad portion is provided in an insulating film of the interconnection layer. A recess corresponding to the pad portion is provided in an insulating film of the interlayer film layer. A barrier metal and a metal film are deposited in both the recesses, and unnecessary portions of the barrier metal and the metal film are removed by CMP, to form a multilayer interconnection structure.

22 Claims, 19 Drawing Sheets

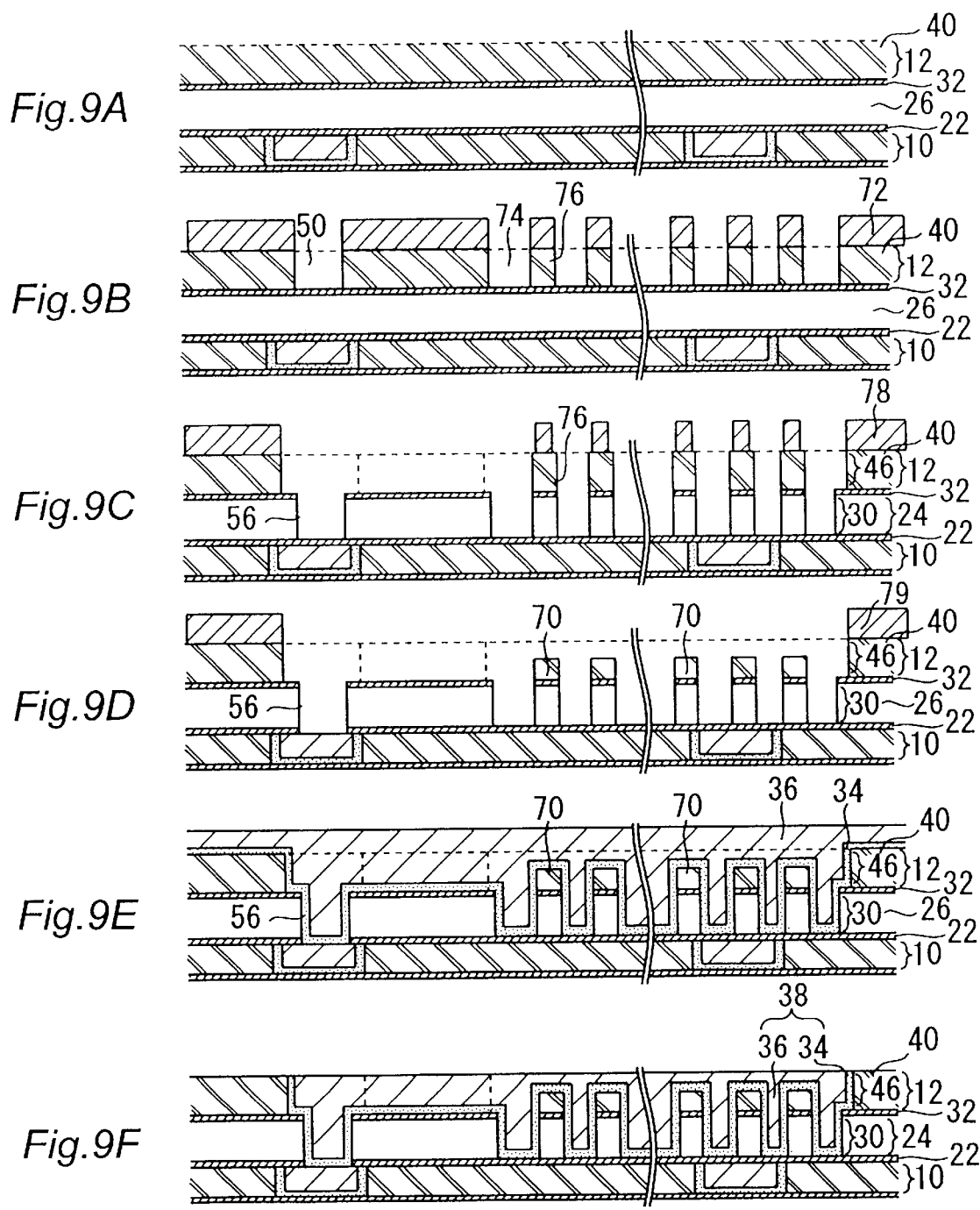

US 6,424,042 B1

SEMICONDUCTOR DEVICE AND MANUFACTURING METHOD THEREOF

BACKGROUND OF THE INVENTION

1. Field of the Invention

The present invention relates to a semiconductor device and a manufacturing method thereof. More particularly, the present invention relates to a semiconductor device such as a memory apparatus or an information processing apparatus containing electrodes and interconnections, and to a manufacturing method thereof.

2. Description of the Background Art

In a semiconductor device such as a memory apparatus or an information processing apparatus, there has been extensively adopted an interconnection having a Damascene structure using a low resistance material such as AlCu or Cu as an interconnection material, along with the increased level of integration and the increased speed of operation. The interconnection having the Damascene structure is formed by forming a recess in an interlayer film or the like for containing an wiring portion and a contact portion, filling the recess with an interconnection material, and removing an unnecessary portion of the interconnection material other than the portion thereof filled in the recess by CMP (Chemical Mechanical Polishing).

At the step of removing the unnecessary portion of the interconnection material by CMP, a portion near the surface of the interconnection material buried in the above-described recess is removed together with the unnecessary portion. As a result, a dish-like depression is liable to be formed on the surface portion of the interconnection having the Damascene structure. Hereinafter, such a phenomenon is referred to as a "dishing".

The above-described dishing reduces the film thickness of an interconnection, to increase the resistance of the interconnection and to degrade the flatness of the interconnection. The dishing significantly occurs at a portion having a large area as compared with wiring portions, specifically, at a contact pad portion provided in an intermediate layer of the semiconductor device and a bonding pad portion provided at the uppermost layer of the semiconductor device.

The dishing significantly occurring at the contact pad portion increases the resistance of the interconnection and degrades the flatness of the intermediate layer, thereby making it difficult to form a desirable multilayer interconnection structure. The dishing significantly occurring at the bonding pad portion increases the resistance of the interconnection and degrades the flatness of the uppermost layer, thereby tending to cause a bonding failure. In this way, the prior art interconnection having the Damascene structure has been largely affected by the dishing.

SUMMARY OF THE INVENTION

The present invention has been conceived to solve the previously-mentioned problems, and a first object of the present invention is to provide a semiconductor device having an interconnection structure capable of sufficiently suppressing the resistance of an interconnection irrespective of occurrence of the dishing, and a manufacturing method thereof.

A second object of the present invention is to provide a semiconductor device having an interconnection structure capable of suppressing occurrence of the dishing, and a manufacturing method thereof.

The above objects of the present invention are achieved by a semiconductor device including an interconnection having a Damascene structure. The device includes an interconnection layer formed on an interlayer film layer. An interconnection is provided so as to have single layer portion contained in a recess formed in the interconnection layer and a double layer portion contained in a recess formed in both the interconnection layer and the interlayer film layer. The double layer portion is formed on an insulating film.

The above objects of the present invention are achieved by a semiconductor device including an interconnection having a Damascene structure. The device includes an interconnection contained in a recess formed in an interconnection layer. A plurality of dummies made from an insulating material are provided in the interconnection. Each of the dummies is a projection which has a specific height and extends from the bottom surface to the top surface of the interconnection. The above objects of the present invention are achieved by a method for manufacturing a semiconductor device including an interconnection having a Damascene structure. In the method, an insulating film of an interconnection layer is formed on an interlayer film of an interlayer film layer. A first recess is formed in the interlayer film. A second recess larger than the first recess is formed in the insulating film so as to overlap with the first recess. The first recess and the second recess are filled with a conductive material, thereby formed an interconnection. The interconnection is formed so as to lie on an insulating film in the first recess.

Other objects and further features of the present invention will be apparent from the following detailed description when read in conjunction with the accompanying drawings.

BRIEF DESCRIPTION OF THE DRAWINGS

FIGS. 9A to 9F are sectional views for describing a method for manufacturing the multilayer interconnection structure shown in FIG. 7;

DESCRIPTION OF THE PREFERRED EMBODIMENTS

Figure 1:
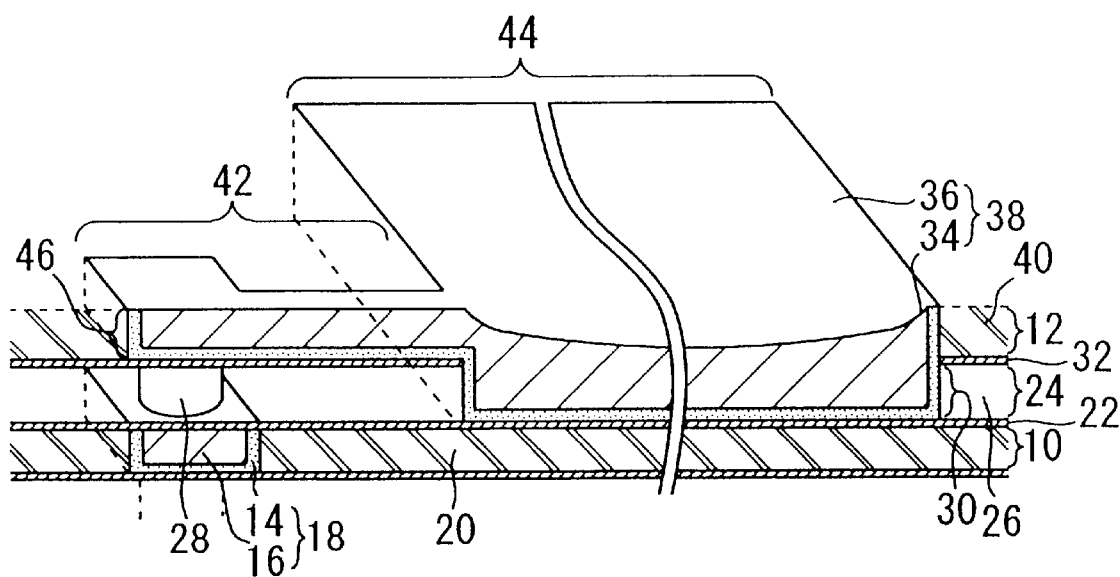
FIG. 1 is a perspective view showing a multilayer interconnection structure of a semiconductor device according to a first embodiment of the present invention.

Hereinafter, embodiments of the present invention will be described with reference to the drawings. In these drawings, like or similar parts are designated by like reference numerals and the explanation thereof is omitted.

First Embodiment

FIG. 1 is a perspective view showing an essential portion of a semiconductor device according to a first embodiment of the present invention. The semiconductor device in this embodiment has a multilayer interconnection structure having multiple interconnection layers, of which an interconnection layer 10 as the (N-1)-th layer (hereinafter, referred to as "(N-1)-th interconnection layer 10") and an interconnection layer 12 as the N-th layer (hereinafter, referred to as "N-th interconnection layer 12" are shown in FIG. 1.

The (N-1)-th interconnection layer 10 includes an interconnection 18 composed of a barrier metal 14 and a metal film 16, and an insulating film 20 which surrounds the interconnection 18. The barrier metal 14 is made from titanium nitride (TiN) and the insulating film 20 is made from silicon oxide.

An interlayer film layer 24 is stacked on the interconnection layer 10 via an insulating barrier film 22 (for example, silicon oxide film). The interlayer film layer 24 comprises a contact 28 communicating with the interconnection 18 and an interlayer film 26 made from silicon oxide, and also includes a recess 30 for containing part of an interconnection of the N-th interconnection layer 12.

The N-th interconnection layer 12 is stacked on the interlayer film layer 24 via an etching stopper film 32 made from silicon nitride. The N-th interconnection layer 12 includes an interconnection 38 composed of a barrier metal 34 and a metal film 36, and an insulating film 40 which surrounds the interconnection 38. The interconnection 38 of the N-th interconnection layer 12 is conducted to the interconnection 18 of the (N-1)-th interconnection layer 12 via the contact 28, and includes an wiring portion 42 having a relatively narrow width and a pad portion 44 having a width larger than that of the wiring portion 42. The pad portion 44 is formed a square shape having one side ranging from about 25 μm to about 200 μm.

In this embodiment, the wiring portion 42 is contained in a recess 46 formed in the insulating film 40 of the N-th interconnection layer 12. On the other hand, the pad portion 44 is contained in both the recess 46 of the N-th interconnection layer 12 and the recess 30 of the interlayer film layer 24. Accordingly, the wiring portion 42 has a film thickness nearly equal to that of the N-th wiring portion 12, and the pad portion 44 has a film thickness equivalent to the sum of the film thickness of the N-th interconnection layer 12 and the film thickness of the interlayer film layer 24.

A method of manufacturing the multilayer interconnection structure shown in FIG. 1 will be described below with reference to FIGS. 2A to 2E.

Figure 2A:
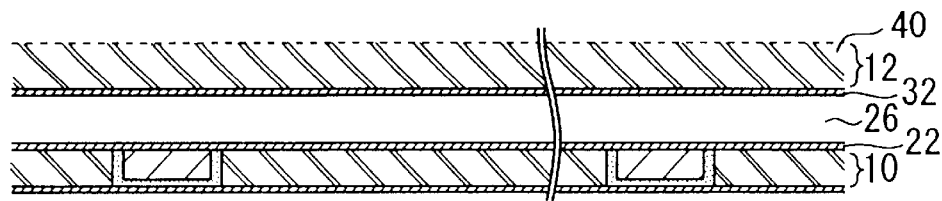
FIGS. 2A to 2E are sectional views for describing a method for manufacturing the multilayer interconnection structure shown in FIG. 1.

According to the manufacturing method in this embodiment, as shown in FIG. 2A, after formation of an (N-1)-th interconnection layer 10, the barrier film 22, the interlayer film 26 of the interlayer film layer 24, the etching stopper film 32, and the insulating film 40 of the N-th interconnection layer 12 are sequentially stacked on the (N-1)-th interconnection layer 10.

Figure 2B:
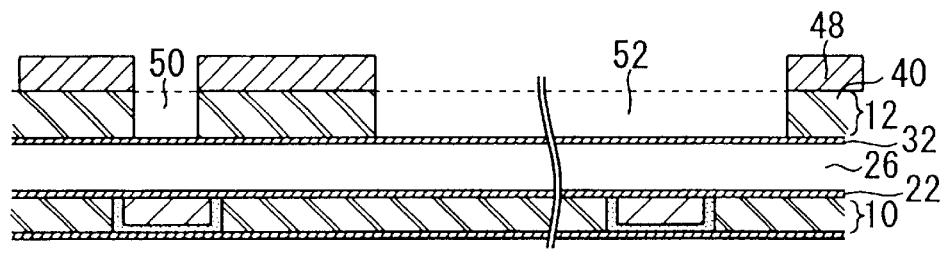

Referring to FIG. 2B, a resist film 48 having openings at portions corresponding to the contact 28 and the pad portion 44 is formed on the insulating film 40 of the N-th interconnection layer 12 by photolithography. The insulating film 40 is then dry-etched by using the resist film 48 as a mask and the etching stopper film 32 as a stopper, to form recesses 50 and 52 corresponding to the contact 28 and the pad portion 44 in the insulating film 40 of the N-th interconnection layer 12.

Figure 2C:
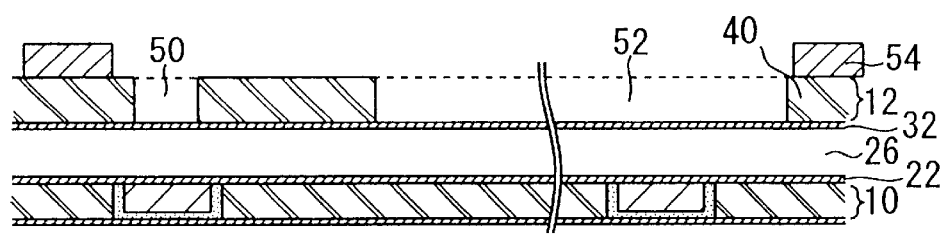

Referring to FIG. 2C, after removal of the resist film 48, a resist film 54 having an opening corresponding to the shape of an interconnection 38 of the N-th interconnection layer 12 is formed on the insulating film 40.

Figure 2D:
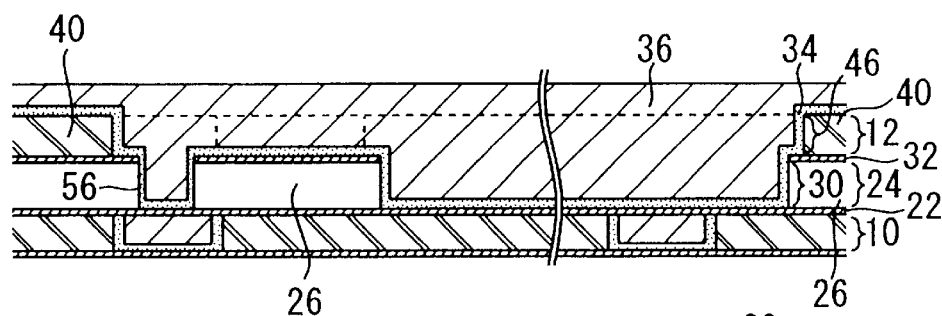

Referring to FIG. 2D, the interlayer film layer 24 and the N-th interconnection layer 12 are dry-etched by using the resist film 54 as a mask, to form a contact hole 56 and a recess 30 in the interlayer film layer 24 and a recess 46 in the N-th interconnection layer 12. The barrier metal 34 and the metal film 36 are formed in such a manner as to cover the interiors of the contact hole 56 and the recesses 30 and 46 and to cover the surface of the insulating film 40.

Figure 2E:
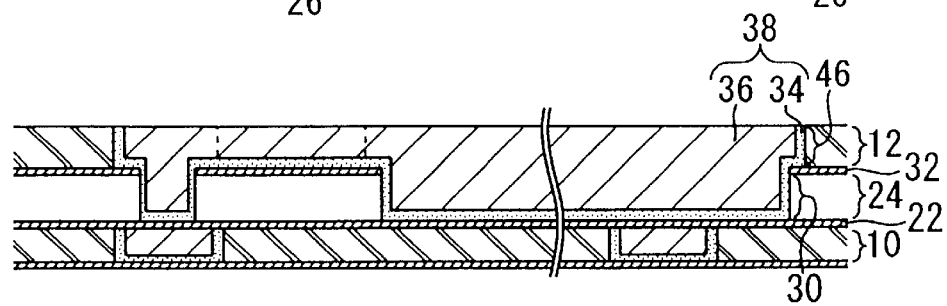

Referring to FIG. 2E, unnecessary portions of the barrier metal 34 and the metal film 36 (portions protruding from the recess 46 of the N-th interconnection layer 12) are removed by CMP, to thus realize the interconnection structure shown in FIG. 1. After that, by repeating the same procedure as that described above, (N+1)-th and later interconnection layers can be formed.

In the manufacturing process of a semiconductor device in this embodiment, when the unnecessary portions of the barrier metal 34 and the metal film 36 are removed by CMP, there occurs the so-called dishing of the interconnection 38, that is, the phenomenon in which a dish-like depression is formed on the surface portion of the interconnection 38. In general, the dishing is liable to occur at a portion having a large pattern width. Accordingly, for the interconnection structure shown in FIG. 1, the size of the dish-like depression formed in the pad portion 44 is larger than that of the wiring portion 42.

According to the structure of the semiconductor device in this embodiment, however, the pad portion 44 being wide in pattern width has the film thickness nearly equal to the sum of the film thickness of the N-th interconnection layer 12 and the film thickness of the interconnection film layer 24. Thus, the film thickness of the pad portion 44 can be sufficiently ensured irrespective of occurrence of the dishing.

Figure 3:
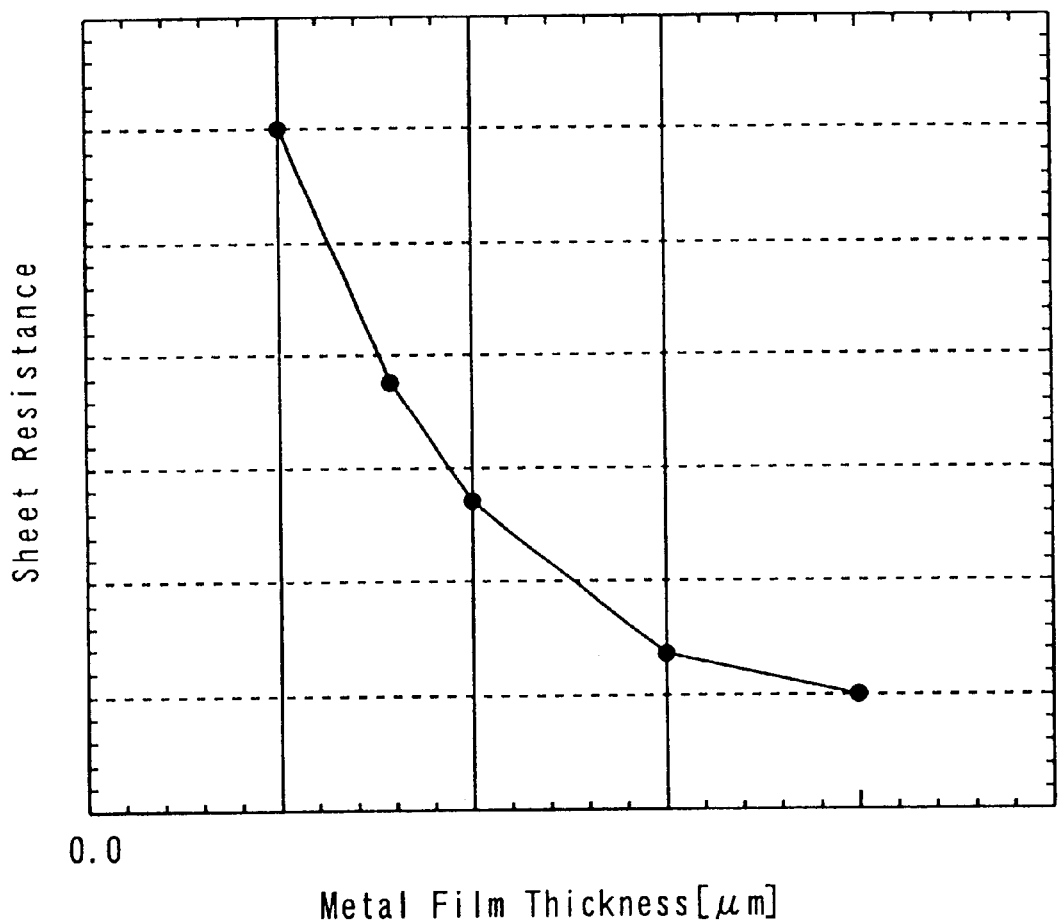
FIG. 3 is a graph showing a relationship between the film thickness of a metal film of a interconnection and a sheet resistance value of the same.

FIG. 3 shows a relationship between the film thickness of the metal film 36 and the sheet resistance value thereof. As shown in FIG. 3, the sheet resistance value of the metal film 36 becomes smaller with an increase in film thickness of the same. Thus, according to the semiconductor device in this embodiment, it is possible to suppress the sheet resistance of the pad portion 44 irrespective of occurrence of the dishing, and hence to sufficiently reduce the resistance of the interconnection.

Second Embodiment

A semiconductor device according to a second embodiment of the present invention will be described with reference to FIG. 4, FIG. 5 and FIGS. 6A to 6E.

Figure 4:
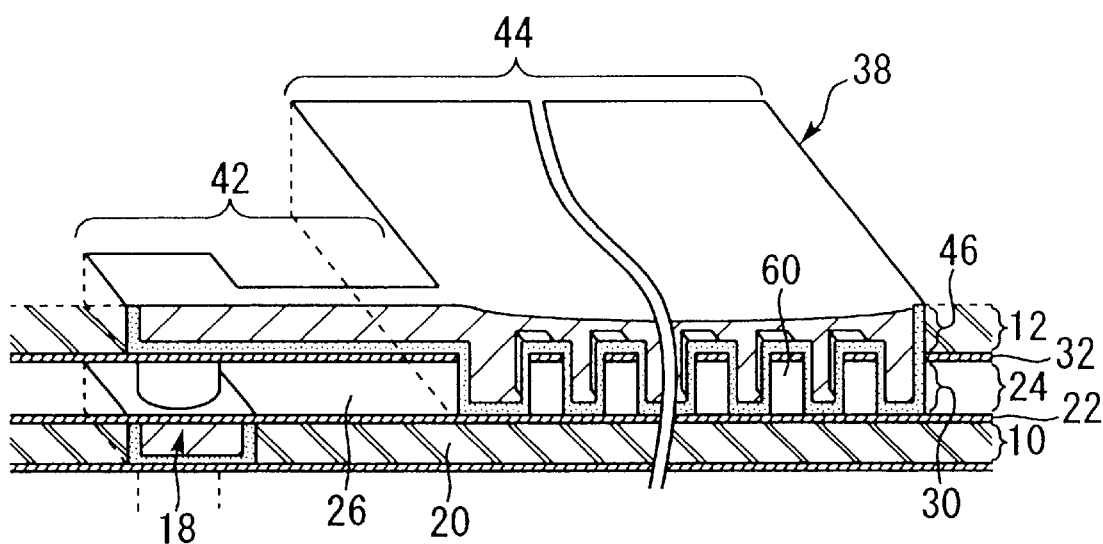
FIG. 4 is a perspective view showing a multilayer interconnection structure of a semiconductor device according to a second embodiment of the present invention.

FIG. 4 is a perspective view showing an (N−1)-th interconnection layer 10 and an N-th interconnection layer 12 of a semiconductor device in this embodiment. The semiconductor device in this embodiment has the same configuration as that of the semiconductor device in the first embodiment except that a plurality of dummies 60 are provided in an interconnection 38 of the N-th interconnection layer 12. The dummy 60 is a square pillar having one side of several $\mu$m, and is formed in the recess 30 of an interlayer film layer 24 from the same silicon oxide film as that of an interlayer film 26.

Figure 5:
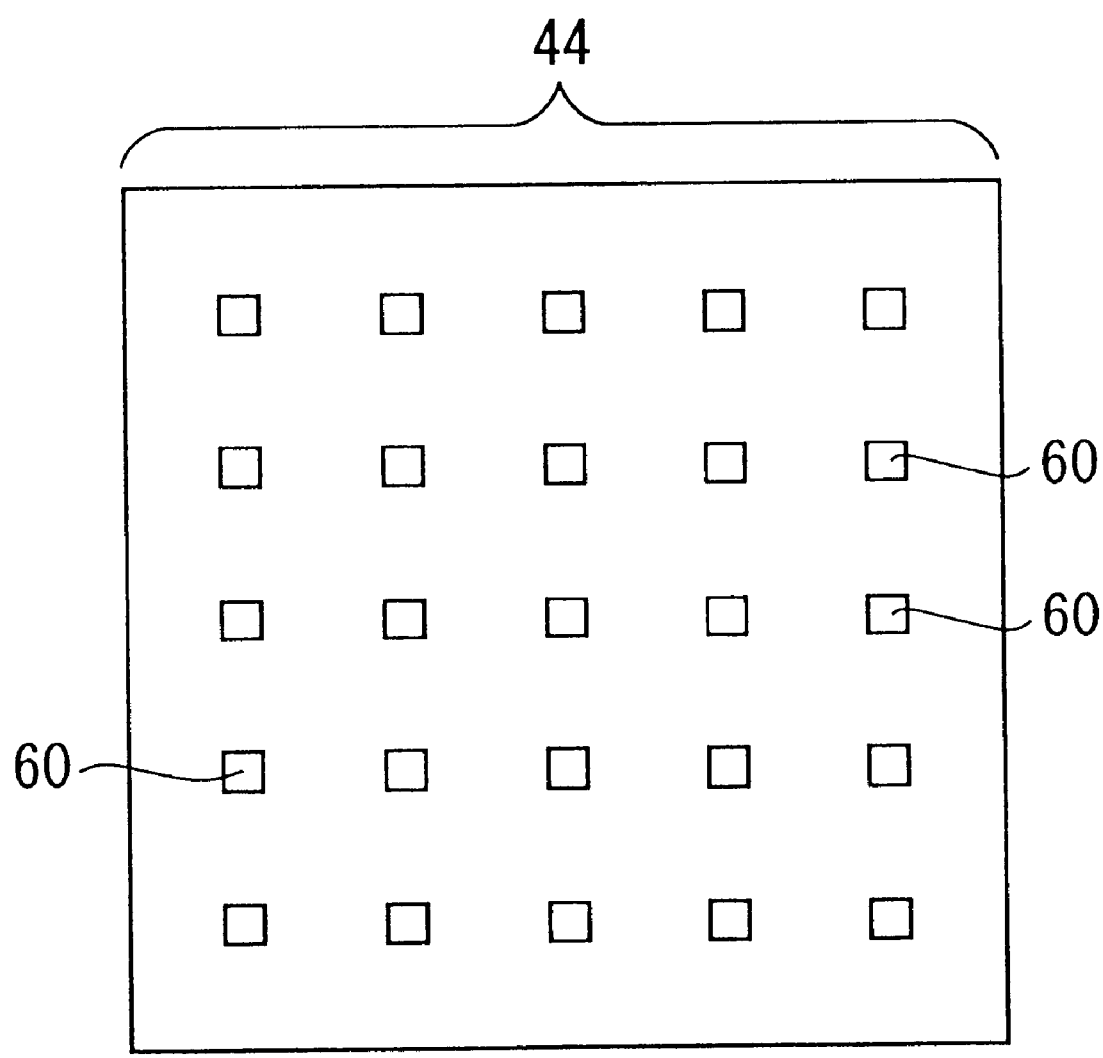
FIG. 5 is a plan view showing an arrangement of dummies formed in the multilayer interconnection structure shown in FIG. 4.

FIG. 5 is a plan view showing the arrangement of the dummies 60. As shown in FIG. 5, the dummies 60 in this embodiment are uniformly distributed over the area of a pad portion 44. While the dummies 60 are provided only in the pad portion 44 in this embodiment, they may be provided in both the pad portion 44 and an wiring portion 42.

A method of manufacturing a multilayer interconnection structure shown in FIG. 4 will be described with reference to FIGS. 6A to 6E.

Figure 6A:
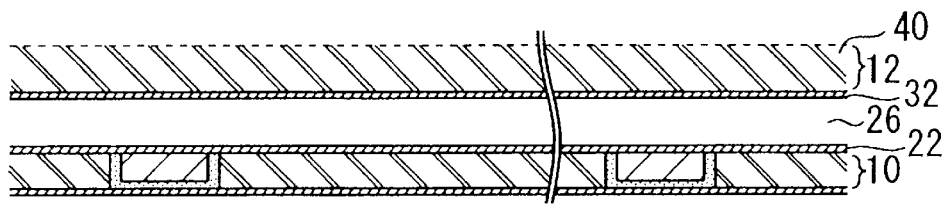
FIGS. 6A to 6E are sectional views for describing a method for manufacturing the multilayer interconnection structure shown in FIG. 4.

Referring to FIG. 6A, a barrier film 22, an interlayer film 26 of an interlayer film layer 24, an etching stopper 32, and an insulating film 40 of an N-th interconnection layer 12 are stacked on an (N−1)-th interconnection layer 10 as with the case in the first embodiment.

Figure 6B:
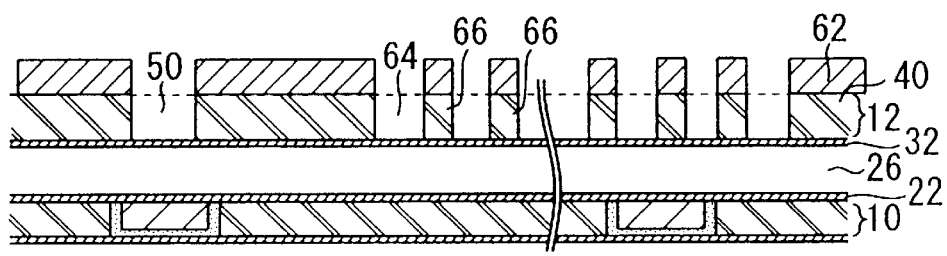

Referring to FIG. 6B, a resist film 62 is formed on the insulating film 40 of the N-th interconnection layer 12. The resist film 62 has openings at portions corresponding to a contact 28 and a pad portion 44, while covering portions at which dummies 60 are to be formed. The insulating film 40 is dry-etched by using the resist film 62 as a mask and the etching stopper film 32 as a stopper, to thus form a recess 50 corresponding to the contact 28 and a recess 64 having an outer shape corresponding to that of the pad portion 44 in the insulating film 40 of the N-th interconnection layer 12. At this time, a patterned silicon oxide film 66 corresponding to the dummies 60 remains in the recess 64.

Figure 6C:
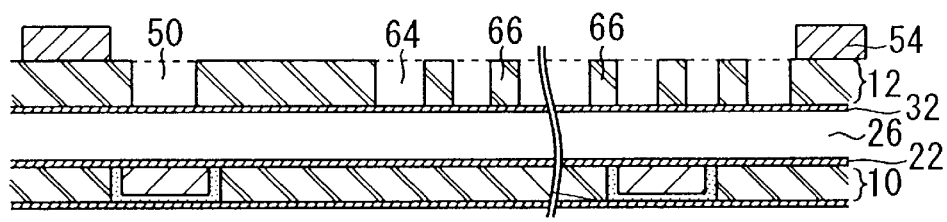

Referring to FIG. 6C, after removal of the resist film 62, a resist film 54 having an opening corresponding to the shape of an interconnection 38 of the N-th interconnection layer 12 is formed on the insulating film 40.

Figure 6D:
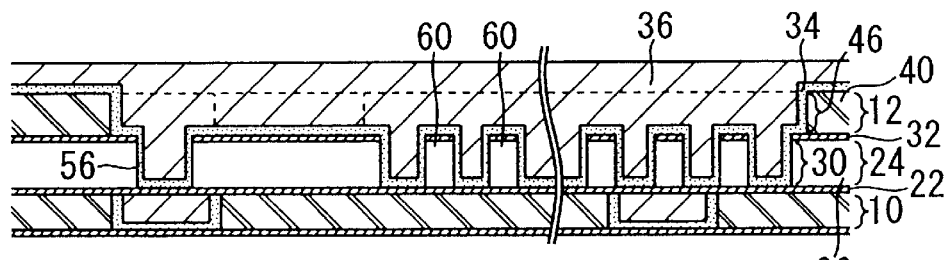

Referring to FIG. 6D, the interlayer film layer 24 and the N-th interconnection layer 12 are dry-etched by using the resist film 54 and the patterned silicon oxide film 66 as a mask, to form a contact hole 56 and a recess 30 in the interlayer film layer 24 as well as a recess 46 in the N-th interconnection layer 12. At this time, in the recess 30, the dummies 60 are formed at the portions covered with the patterned silicon oxide film 66. Then, a barrier metal 34 and a metal film 36 are formed in such a manner as to cover the interiors of the contact hole 56, the recesses 30 and 46, and the surface of the insulating film 40.

Figure 6E:
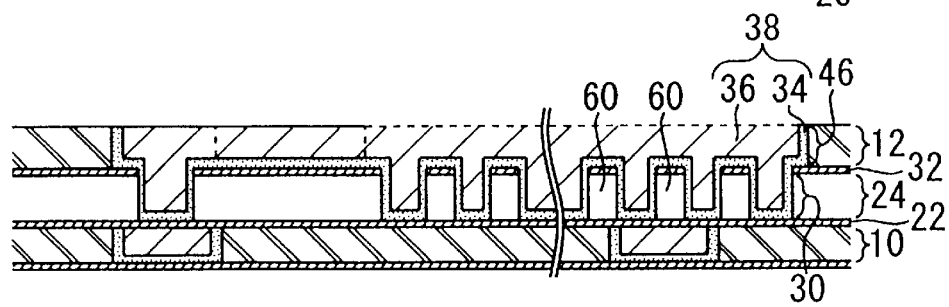

Referring to FIG. 6E, unnecessary portions of the barrier metal 34 and the metal film 36 (portions protruding from the recess 46 of the N-th interconnection layer 12) are removed by CMP, to thus realize the interconnection structure shown in FIG. 4. After that, by repeating the same procedure as that described above, (N+1)-th and later interconnection layers can be formed.

In the structure in which the dummies 60 are formed in the interlayer film layer 24, the surface portion of the interconnection 38 becomes hard to be removed by CMP as compared with in the structure in which the dummies 60 are not formed. As a result, according to the manufacturing method in this embodiment, it is possible to further suppress the occurrence of the dishing at the pad portion 44 as compared with the manufacturing method in the first embodiment, and hence to easily realize a multilayer interconnection structure with sufficiently reduced resistance of interconnections and to realize a semiconductor device with less occurrence of a bonding failure.

Third Embodiment

A semiconductor device according to a third embodiment of the present invention will be described with reference to FIG. 7, FIGS. 8A and 8B, as well as FIGS. 9A to 9F.

Figure 7:
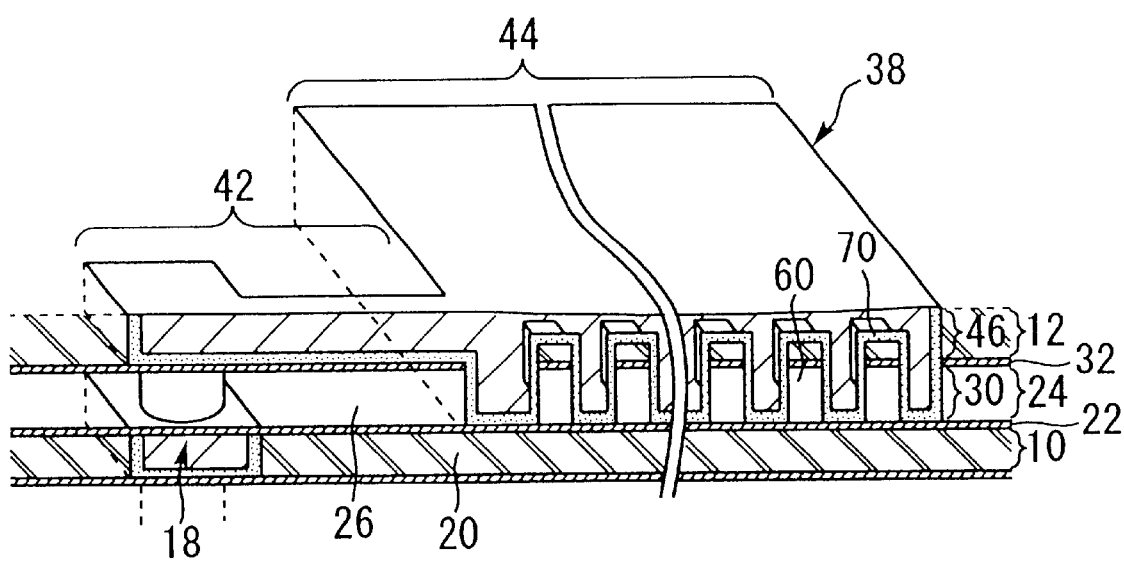
FIG. 7 is a perspective view showing a multilayer interconnection structure of a semiconductor device according to a third embodiment of the present invention.

FIG. 7 is a perspective view showing an (N−1)-th interconnection layer 10 and an N-th interconnection layer 12 of a semiconductor device in this embodiment. The semiconductor device in this embodiment has the same configuration as that of the semiconductor device in the second embodiment except that dummies 70 are provided in an interconnection 38 of the N-th interconnection layer 12 in place of the dummies 60. The dummy 70 is a square pillar having one side of several $\mu$m, and is formed in such a manner as to extend from the bottom surface of a recess 30 of an interlayer film layer 24 up to the midway of a recess 46 of the N-th interconnection layer 12.

Figure 8A:
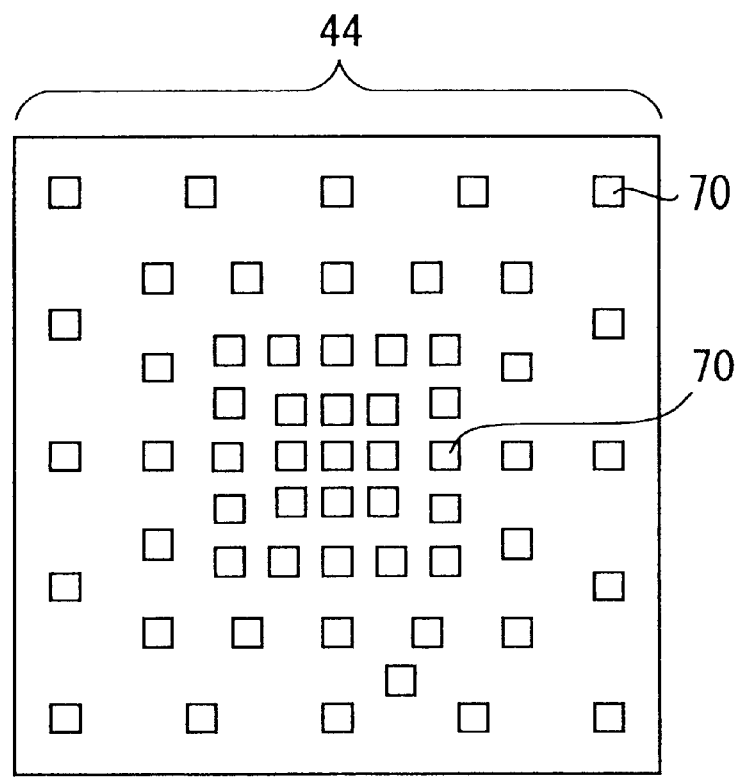
FIGS. 8A and 8B are plan views each showing an arrangement of dummies formed in the multilayer interconnection structure shown in FIG. 7.
Figure 8B:
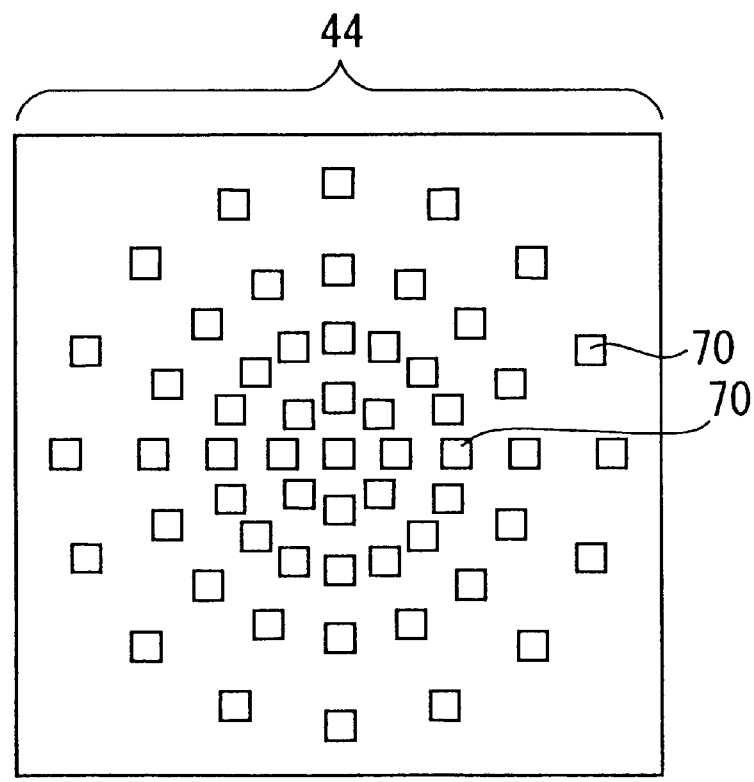

FIGS. 8A and 8B are plan views each showing an arrangement example of the dummies 70. As shown in FIGS. 8A or 8B, the dummies 70 in this embodiment are arranged on concentric square loops or concentric circular loops in such a manner as to be spaced from each other at intervals on each loop. In this case, the distribution density of the dummies 70 is specified to be highest at the central portion of the pad portion 44 and to become lower in the direction from the central portion to the peripheral edge portion of the pad portion 44. While the dummies 70 are provided only in the pad portion 44 in this embodiment, they may be provided in both the pad portion 44 and an wiring portion 42.

A method of manufacturing a multilayer interconnection structure shown in FIG. 7 will be described with reference to FIGS. 9A to 9F.

Referring to FIG. 9A, a barrier film 22, an interlayer film 26 of an interlayer film layer 24, an etching stopper 32, and an insulating film 40 of an N-th interconnection layer 12 are stacked on an (N−1)-th interconnection layer 10 as with the case in the first embodiment.

Referring to FIG. 9B, a resist film 72, which has openings at portions corresponding to a contact 28 and a pad portion 44 and covers portions at which the dummies 70 are to be formed, is formed on the insulating film 40 of the N-th interconnection layer 12. The insulating film 40 is dry-etched by using the resist film 72 as a mask and the etching stopper film 32 as a stopper, to thus form a recess 50 corresponding to the contact 28 and a recess 74 having an outer shape corresponding to that of the pad portion 44 in the insulating film 40 of the N-th interconnection layer 12. At this time, a patterned silicon oxide film 76 corresponding to the dummies 70 remains in the recess 74.

Referring to FIG. 9C, after removal of the resist film 72, a resist film 78 is formed on the insulating film 40. The resist film 78 is patterned to have an opening corresponding to an interconnection 38 of the N-th interconnection layer 12 and to cover the patterned silicon oxide film 76 corresponding to the dummies 70. The interlayer film layer 24 and the N-th interconnection layer 12 are dry-etched by using the resist film 78 as a mask, to form a contact hole 56 and the recess 30 in the interlayer film layer 24 and the recess 46 in the N-th interconnection layer 12. At this time, the patterned silicon oxide film 76 corresponding to the dummies 70 remains in the recesses 30 and 46.

Referring to FIG. 9D, after removal of the resist film 78, a resist film 79 having an opening corresponding to the shape of the interconnection 38 of the N-th interconnection layer 12 is formed on the insulating film 40. The patterned silicon oxide film 76 is dry-etched by using the resist film 79 as a mask, to remove a specific amount of the patterned silicon oxide film 76. As a result, the dummies 70 extending up to the midway of the recess 46 of the N-th interconnection layer 12 are formed in the recess 46.

Referring to FIG. 9E, a barrier metal 34 and a metal film 36 are formed in such a manner as to cover the interiors of the contact hole 56 and the recesses 30 and 46, and to cover the surface of the insulating film 40.

Referring to FIG. 9F, unnecessary portions of the barrier metal 34 and the metal film 36 (portions protruding from the recess 46 of the N-th interconnection layer 12) are removed by CMP, to thus realize the interconnection structure shown in FIG. 7. After that, by repeating the same procedure as that described above, (N+1)-th and later interconnection layers can be formed.

In the structure in which the dummies 70 are formed in the interconnection 38, the surface portion of the interconnection 38 becomes hard to be removed by CMP as compared with in the structure in which the dummies 70 are not formed. In particular, according to this embodiment, the dummies 70 are provided in such a manner as to be distributed with a higher density in the vicinity of the central portion of the pad portion 44 which is liable to be largely depressed by the dishing and also to extend up to the midway of the N-th interconnection layer 12. As a result, according to the manufacturing method in this embodiment, it is possible to further suppress the degree of the depression of the pad portion 44 caused by the dishing as compared with the manufacturing method in the second embodiment.

Fourth Embodiment

A semiconductor device according to a fourth embodiment of the present invention will be described with reference to FIG. 10, FIG. 11 and FIGS. 12A to 12F.

Figure 10:
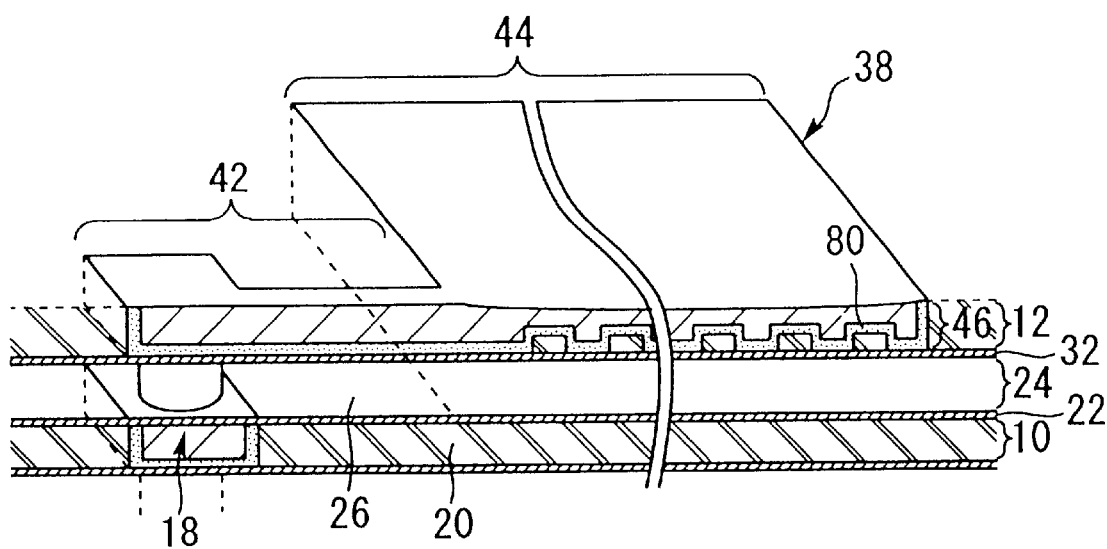
FIG. 10 is a perspective view showing a multilayer interconnection structure of a semiconductor device according to a fourth embodiment of the present invention.

FIG. 10 is a perspective view showing an (N−1)-th interconnection layer 10 and an N-th interconnection layer 12 of a semiconductor device in this embodiment. The semiconductor device in this embodiment has the same configuration as that of the semiconductor device in the first embodiment except that an interconnection 38 is formed in such a manner as to be contained in the N-th interconnection layer 12 and dummies 80 are formed in the interconnection 38. The dummy 80 is a square pillar having one side of several μm, and is formed on an etching stopper film 32 in such a manner as to extend up to the midway of the N-th interconnection layer 12.

Figure 11:
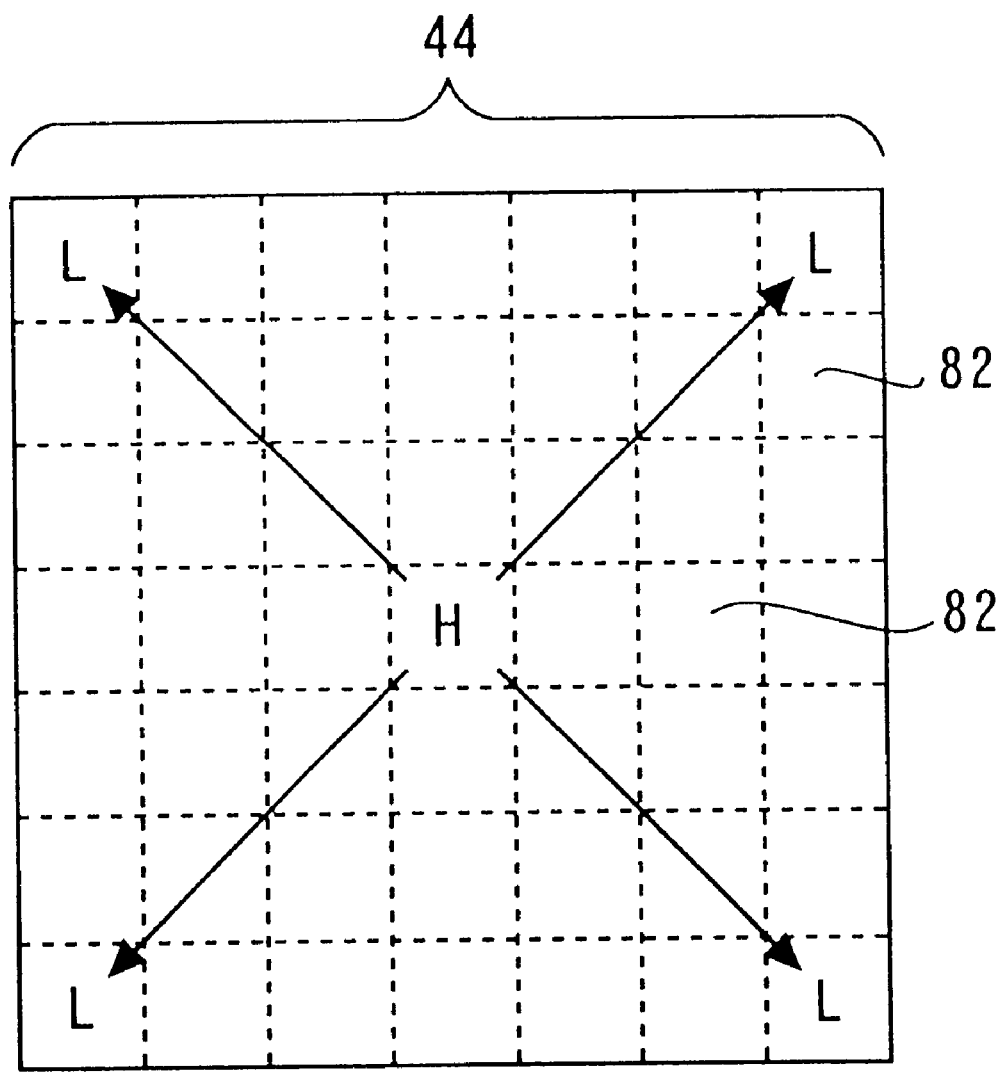
FIG. 11 is a schematic view showing an occupancy of dummies formed in the multilayer interconnection structure shown in FIG. 10.

FIG. 11 is a schematic view showing an occupancy of the dummies 80 at each region of the pad portion 44. A plurality of broken lines extending in a grid pattern in FIG. 11 designate virtual boundary lines for dividing the pad portion 44 into a plurality of regions 82. Arrows in FIG. 11 show the gradient of the occupancy of the dummies 80 in each of the regions 82. In this embodiment, the dummies 80 are provided in such a manner that the occupancy of the dummies 80 in the region 82 is highest at the central portion of the pad portion 44 and becomes lower in the direction from the central portion to the peripheral portion of the pad portion 44. While the dummies 80 are provided only in the pad portion 44 in this embodiment, they may be provided in both the pad portion 44 and an wiring portion 42.

A method of manufacturing a multilayer interconnection structure shown in FIG. 10 will be described with reference to FIGS. 12A to 12F.

Figures 12A, 12B, 12C, 12D, 12E, 12F:
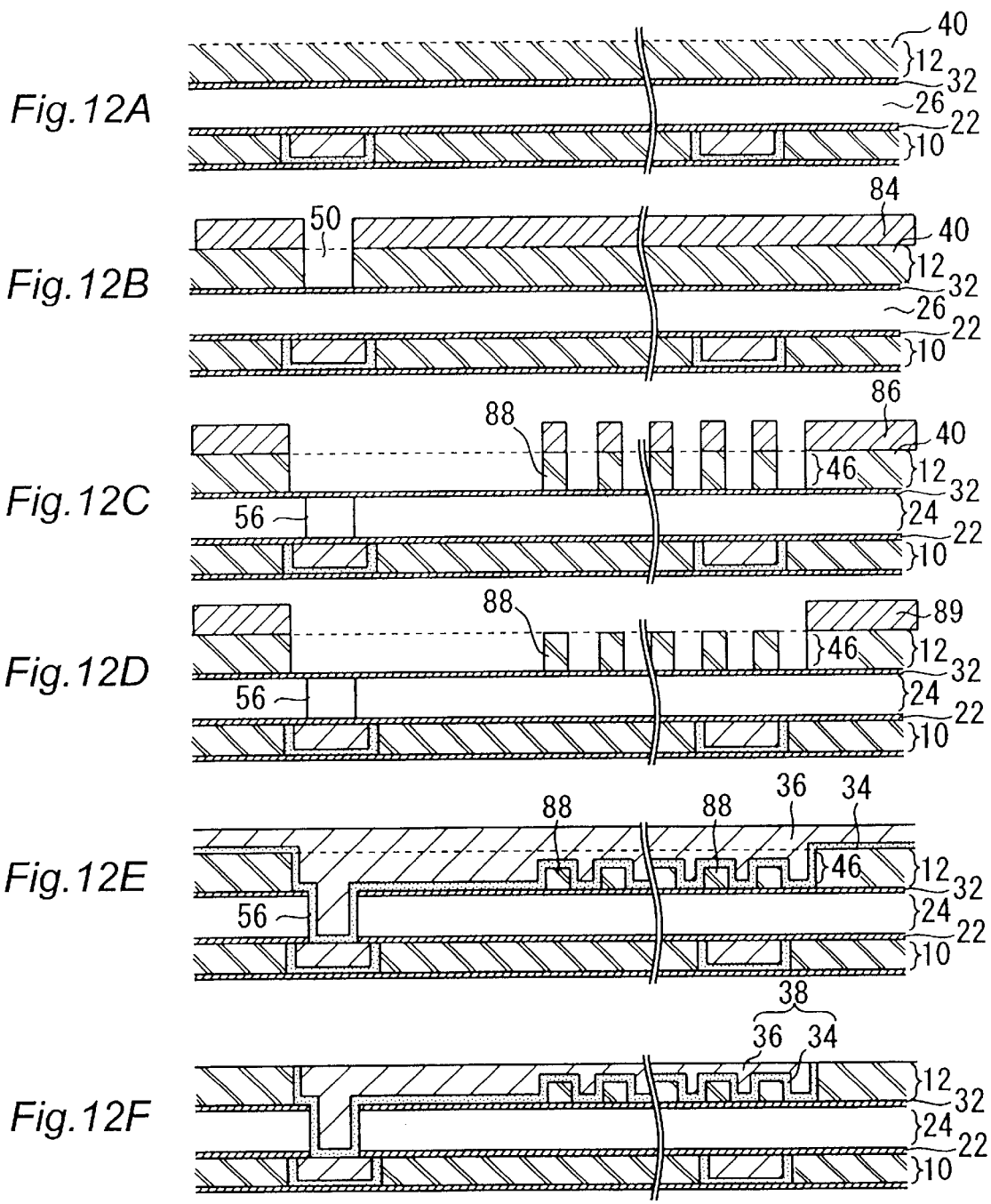
FIGS. 12A to 12F are sectional views for describing a method for manufacturing the multilayer interconnection structure shown in FIG. 10.

Referring to FIG. 12A, a barrier film 22, an interlayer film 26 of an interlayer film layer 24, an etching stopper 32, and an insulating film 40 of an N-th interconnection layer 12 are stacked on an (N−1)-th interconnection layer 10 as with the case in the first embodiment.

Referring to FIG. 12B, a resist film 84 having an opening at a portion corresponding to a contact 28 is formed on the insulating film 40 of the N-th interconnection layer 12. The insulating film 40 is dry-etched by using the resist film 84 as a mask and the etching stopper film 32 as a stopper, to thus form a recess 50 corresponding to the contact 28 in the insulating film 40 of the N-th interconnection layer 12.

Referring to FIG. 12C, after removal of the resist film 84, a resist film 86, which has an opening corresponding to the interconnection 38 of the N-th interconnection layer 12 and covers portions at which the dummies 80 are to be formed, is formed on the insulating film 40 of the N-th interconnection layer 12. The interlayer film layer 24 and the N-th interconnection layer 12 are dry-etched by using the resist film 86 as a mask and the etching stopper film 32 as a stopper, to thus form a contact hole 56 in the interlayer film layer 24 and a recess 46 in the N-th interconnection layer 12. At this time, an patterned silicon oxide film 88 corresponding to the dummies 80 is formed in the recess 46.

Referring to FIG. 12D, after removal of the resist film 86, a resist film 89 having an opening corresponding to the shape of the interconnection 38 of the N-th interconnection layer 12 is formed on the insulating film 40.

Referring to FIG. 12E, the patterned silicon oxide film 88 is dry-etched by using the resist film 89 as a mask, to remove a specific amount of the patterned silicon oxide film 88. As a result, the dummies 80 extending up to the midway of the recess 46 of the N-th interconnection layer 12 are formed in the recess 46. A barrier metal 34 and a metal film 36 are formed in such a manner as to cover the interiors of the contact hole 56 and the recess 46, and to cover the surface of the insulating film 40.

Referring to FIG. 12F, unnecessary portions of the barrier metal 34 and the metal film 36 (portions protruding from the recess 46 of the N-th interconnection layer 12) are removed by CMP, to thus realize the interconnection structure shown in FIG. 10. After that, by repeating the same procedure as that described above, (N+1)-th and later interconnection layers can be formed.

In the structure in which the dummies 80 are formed in the interconnection 38, the surface portion of the interconnection 38 becomes hard to be removed by CMP as compared with in the structure in which the dummies 80 are not formed. In particular, according to this embodiment, the dummies 80 are provided in such a manner as to be distributed at a larger occupancy in the vicinity of the central portion of the pad portion 44 which is liable to be largely depressed by the dishing. As a result, according to the manufacturing method in this embodiment, it is possible to sufficiently suppress the degree of the depression of the pad portion 44 caused by the dishing, and hence to form the interconnection layer having a good flatness.

Fifth Embodiment

A semiconductor device according to a fifth embodiment of the present invention will be described with reference to FIG. 13, FIG. 14 and FIGS. 15A to 15F.

Figure 13:
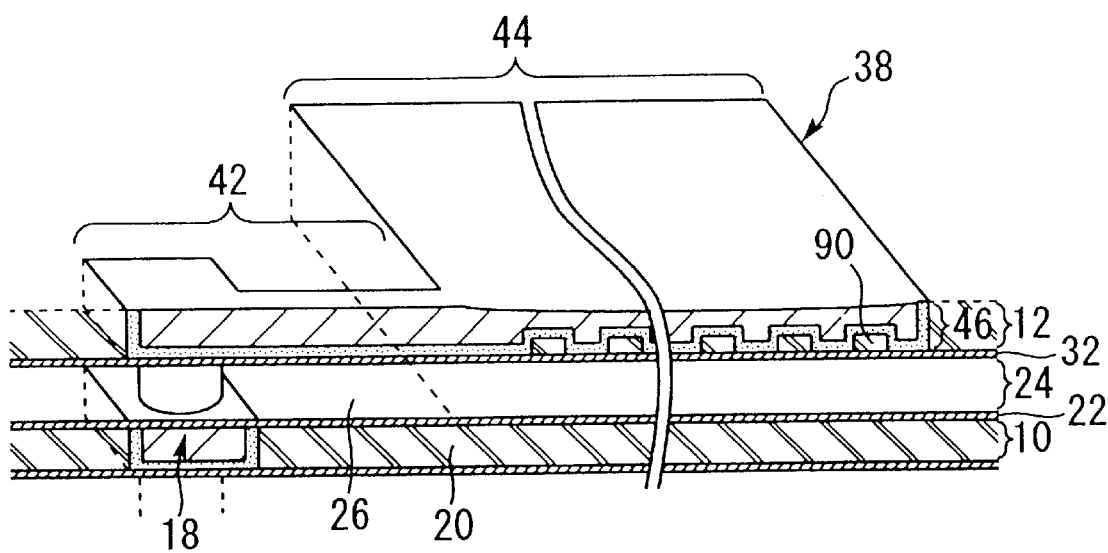
FIG. 13 is a perspective view showing a multilayer interconnection structure of a semiconductor device according to a fifth embodiment of the present invention.

FIG. 13 is a perspective view showing an (N−1)-th interconnection layer 10 and an N-th interconnection layer 12 of a semiconductor device in this embodiment. The semiconductor device in this embodiment has the same configuration as that of the semiconductor device in the fourth embodiment except that dummies 90 are provided in an interconnection 38 in place of the dummies 80. The dummy 90 is a square pillar having one side of several μm, and is formed on an etching stopper film 32 in such a manner as to extend up to the midway of the N-th interconnection layer 12.

Figure 14:
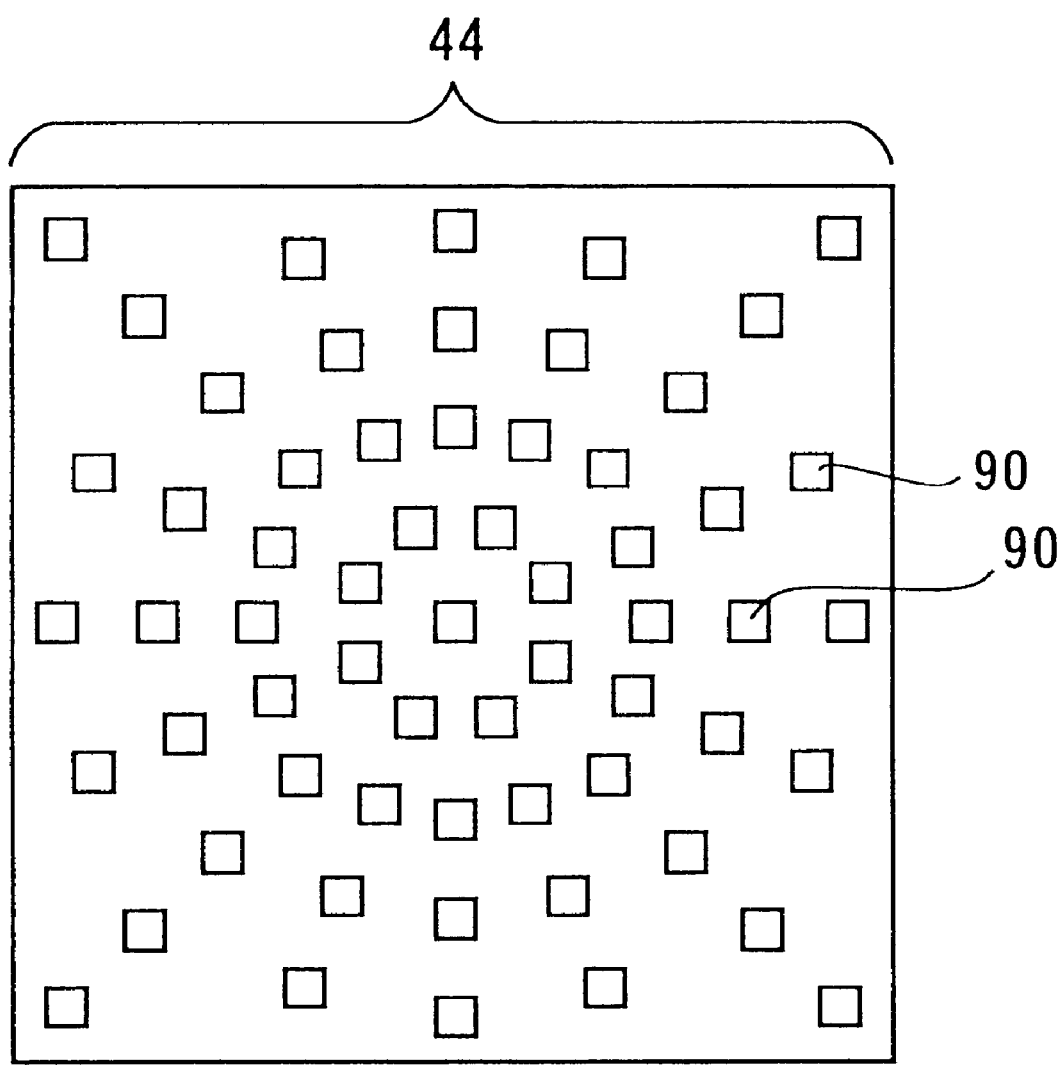
FIG. 14 is a schematic view showing an occupancy of dummies formed in the multilayer interconnection structure shown in FIG. 13.

FIG. 14 is a plan view showing the arrangement of the dummies in a pad portion 44. As shown in FIG. 14, the dummies 90 in this embodiment are radially arranged in such a manner that the arrangement density of the dummies 90 is highest at the central portion of the pad portion 44 and becomes lower in the direction from the central portion to the peripheral portion of the pad portion 44. While the dummies 90 are provided only in the pad portion 44 in this embodiment, they may be provided in both the pad portion 44 and an wiring portion 42.

A method of manufacturing a multilayer interconnection structure shown in FIG. 13 will be described with reference to FIGS. 15A to 15F.

Figure 15:
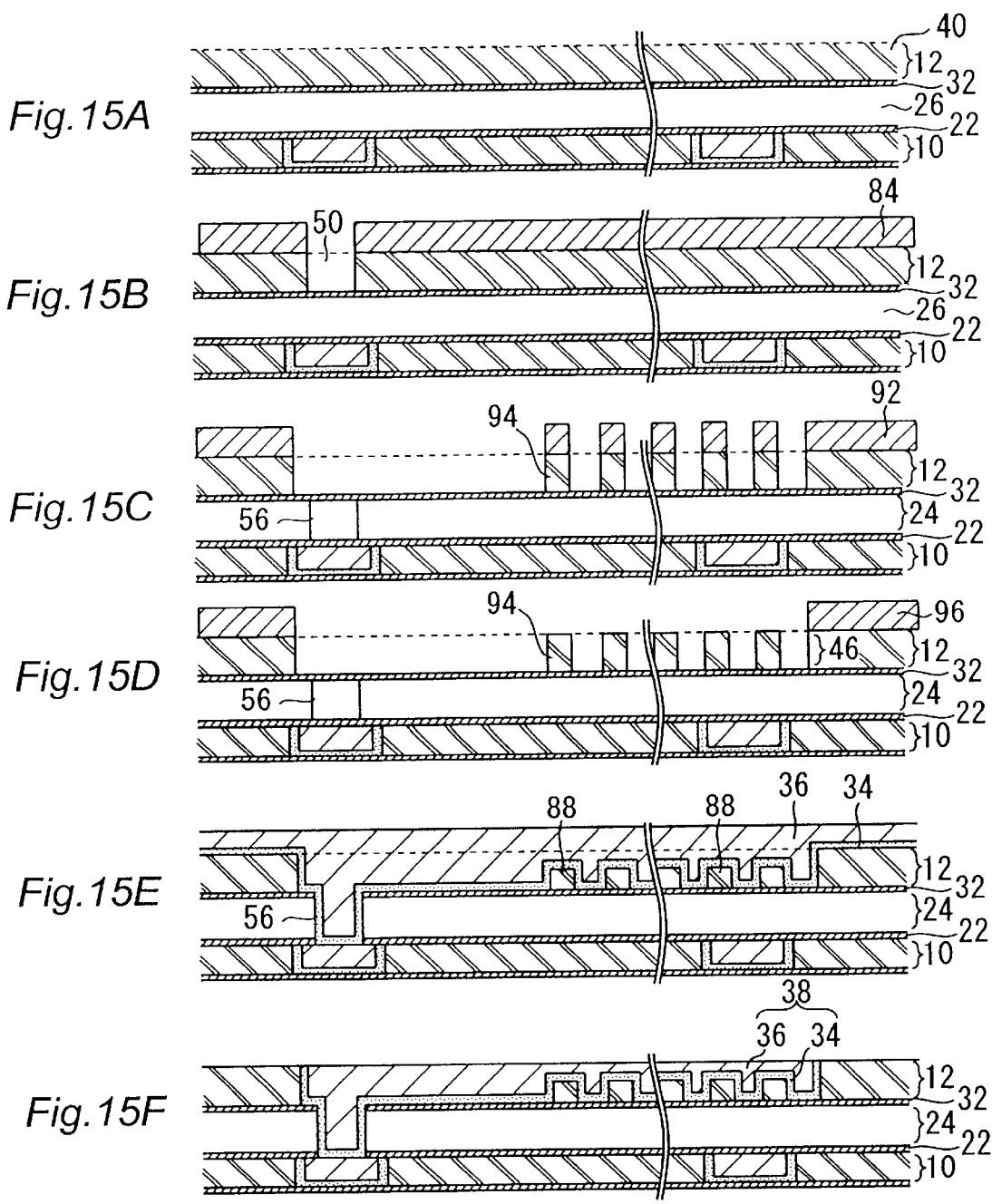
FIGS. 15A to 15F are sectional views for describing a method for manufacturing the multilayer interconnection structure shown in FIG. 13.

In the manufacturing method in this embodiment, the same procedure as that in the fourth embodiment is repeated until a recess 50 corresponding to a contact 28 is formed in an insulating film 40 of an N-th interconnection layer 12 (see FIGS. 15A and 15B).

Referring to FIG. 15C, after removal of the resist film 84, a resist film 92, which has an opening corresponding to the interconnection 38 of the N-th interconnection layer 12 and covers portions at which the dummies 90 are to be formed, is formed on the insulating film 40 of the N-th interconnection layer 12. The interlayer film layer 24 and the N-th interconnection layer 12 are dry-etched by using the resist film 92 as a mask and the etching stopper film 32 as a stopper, to thus form a contact hole 56 in the interlayer film layer 24 and a recess 46 in the N-th interconnection layer 12. At this time, a patterned silicon oxide film 94 corresponding to the dummies 90 is formed in the recess 46.

Thereafter, in accordance with the same procedure as that in the fourth embodiment, the patterned silicon oxide film 94 is etched (see FIG. 15D); a barrier metal 34 and a metal film 36 are deposited (see FIG. 15E); and unnecessary portions of the barrier metal 34 and the metal film 36 are removed by CMP, to realize the interconnection structure shown in FIG. 13 (see FIG. 15F). After that, by repeating the same procedure as that described above, (N+1)-th and later interconnection layers can be formed.

In the structure in which the dummies 90 are formed in the interconnection 38, the surface portion of the interconnection 38 becomes hard to be removed by CMP as compared with in the structure in which the dummies 90 are not formed. In particular, according to this embodiment, the dummies 90 are provided in such a manner as to be distributed with a larger density in the vicinity of the central portion of the pad portion 44 which is liable to be largely depressed by the dishing. As a result, according to the manufacturing method in this embodiment, it is possible to sufficiently suppress the degree of the depression of the pad portion 44 caused by the dishing, and hence to form the interconnection layer having a good flatness.

Sixth Embodiment

A semiconductor device according to a sixth embodiment of the present invention will be described with reference to FIG. 16 and FIGS. 17A to 17F.

Figure 16:
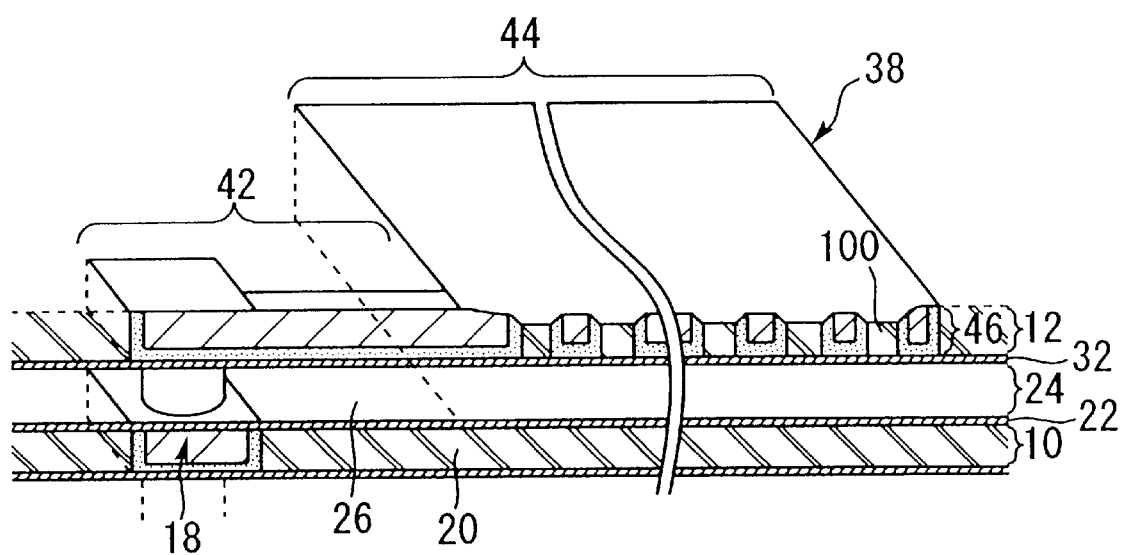
FIG. 16 is a perspective view showing a multilayer interconnection structure of a semiconductor device according to a sixth embodiment of the present invention.

FIG. 16 is a perspective view showing an (N−1)-th interconnection layer 10 and an N-th interconnection layer 12 of a semiconductor device in this embodiment. The semiconductor device in this embodiment has the same configuration as that of the semiconductor device in the fourth or fifth embodiment except that dummies 100 are provided in an interconnection 38 and small irregularities corresponding to the dummies 100 are formed on the surface of the interconnection 38. The dummy 100 is a square pillar having one side of several μm, and is formed on an etching stopper film 32 in such a manner as to extend up to the midway of the N-th interconnection layer 12.

In this embodiment, the dummies 100 are uniformly distributed over the area of a pad portion 44 like the second embodiment (see FIG. 5). While the dummies 100 are provided only in the pad portion 44 in this embodiment, they may be provided in both the pad portion 44 and an wiring portion 42.

A method of manufacturing a multilayer interconnection structure shown in FIG. 16 will be described with reference to FIGS. 17A to 17F.

Figure 17:
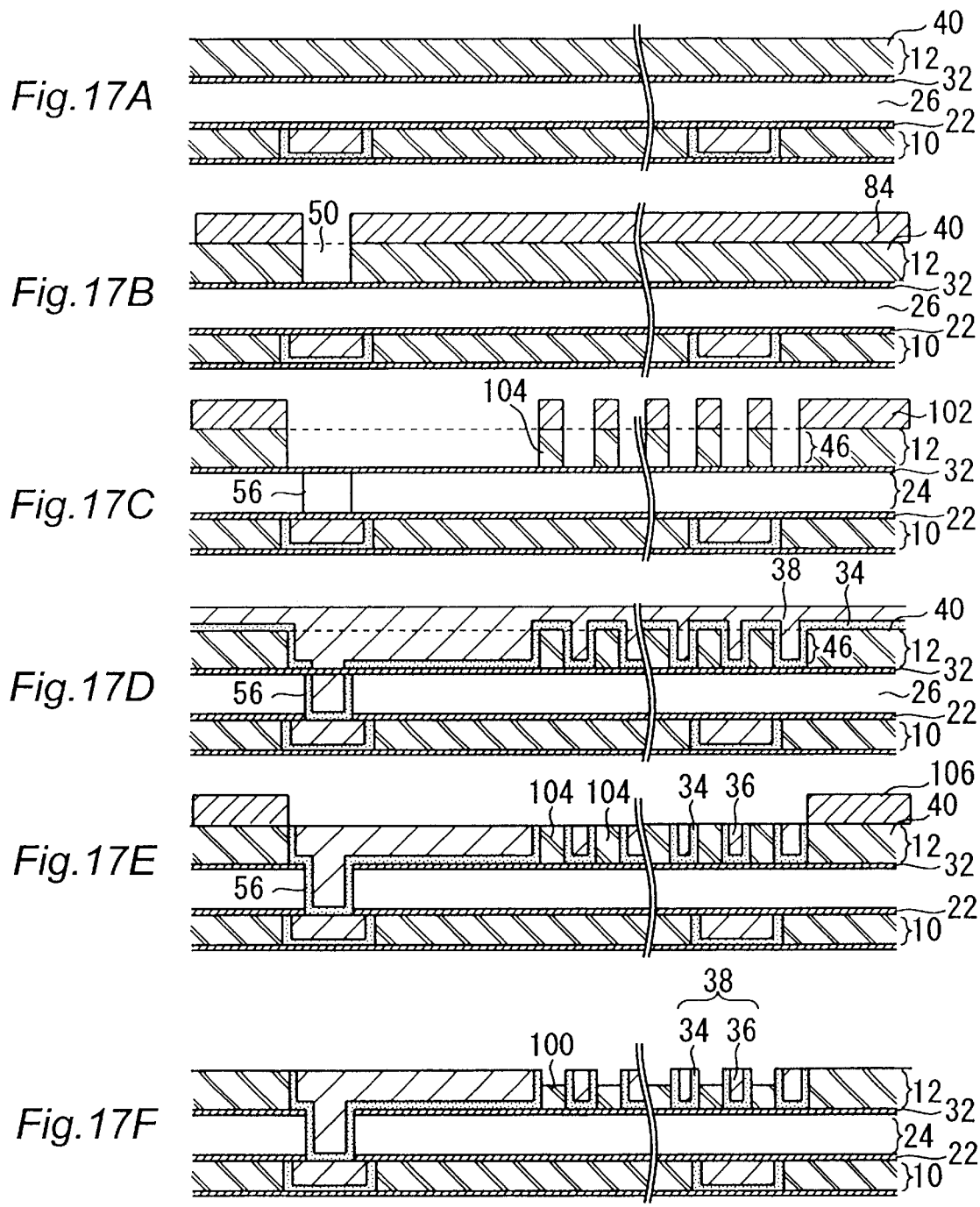
FIGS. 17A to 17F are sectional views for describing a method for manufacturing the multilayer interconnection structure shown in FIG. 16.

In the manufacturing method in this embodiment, the same procedure as that in the fourth embodiment is repeated until a recess 50 corresponding to a contact 28 is formed in an insulating film 40 of an N-th interconnection layer 12 (see FIGS. 17A and 17B).

Referring to FIG. 17C, after removal of a resist film 84 used for forming the recess 50, a resist film 102, which has an opening corresponding to the interconnection 38 of the N-th interconnection layer 12 and covers portions at which the dummies 100 are to be formed, is formed on the insulating film 40. The interlayer film layer 24 and the N-th interconnection layer 12 are dry-etched by using the resist film 102 as a mask and the etching stopper film 32 as a stopper, to thus form a contact hole 56 in the interlayer film layer 24 and a recess 46 in the N-th interconnection layer 12. At this time, a patterned silicon oxide film 104 for forming the dummies 100 is formed in the recess 46.

Referring to FIG. 17D, after removal of the resist film 102, a barrier metal 34 and a metal film 36 are formed in such a manner as to cover the interiors of the contact hole 56 and the recess 46 and to cover the surface of the insulating film 40.

Referring to FIG. 17E, unnecessary portions of the barrier metal 34 and the metal film 36 (portion protruding from the recess 46 of the N-th interconnection layer 12) are removed by CMP. Next, a resist film 106 having an opening of the same shape as that of the interconnection 38 of the N-th interconnection layer 12 is formed on the insulating film 40.

Referring to FIG. 17F, the patterned silicon oxide film 104 is wet-etched by using the resist film 106 as a mask, to remove a specific amount of the same. As a result, the interconnection structure having the dummies 100 in the pad portion 44 as shown in FIG. 16 is realized. After that, by repeating the same procedure as that described above, (N+1)-th and later interconnection layers can be formed.

In the structure in which the dummies 100 are formed in the interconnection 38, the surface portion of the interconnection 38 becomes hard to be removed by CMP as compared with in the structure in which the dummies 100 are not formed. As a result, according to the manufacturing method in this embodiment, it is possible to suppress the degree of the depression of the pad portion 44 caused by the dishing, and hence to form the interconnection layer having a good flatness.

Seventh Embodiment

A semiconductor device according to a seventh embodiment of the present invention will be described with reference to FIG. 18 and FIGS. 19A to 19E.

Figure 18:
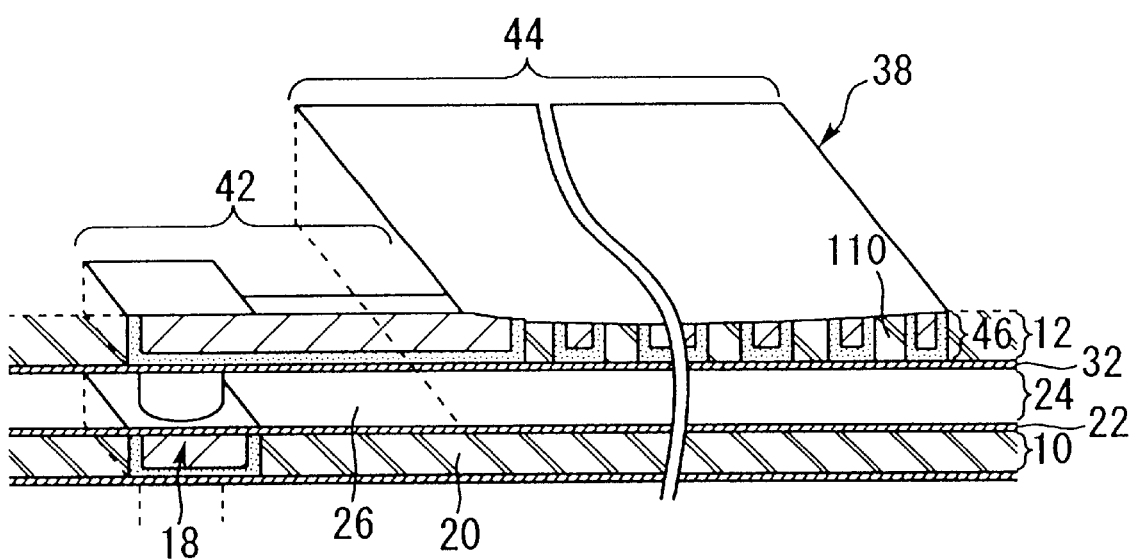
FIG. 18 is a perspective view showing a multilayer interconnection structure of a semiconductor device according to a seventh embodiment of the present invention.

FIG. 18 is a perspective view showing an (N−1)-th interconnection layer 10 and an N-th interconnection layer 12 of a semiconductor device in this embodiment. The semiconductor device in this embodiment has the same configuration as that of the semiconductor device in the sixth embodiment except that dummies 110 are provided in an interconnection 38 in place of the dummies 100. The dummy 110 is a square pillar having one side of several $\mu$m, and is formed on an etching stopper film 32 in such a manner that the height of the upper end surface of the dummy 110 is at the same level as that of the surface height of the interconnection 38.

In this embodiment, the dummies 110 are uniformly distributed over the area of a pad portion 44 like the second embodiment (see FIG. 5). While the dummies 110 are provided only in the pad portion 44 in this embodiment, they may be provided in both the pad portion 44 and an wiring portion 42.

A method of manufacturing a multilayer interconnection structure shown in FIG. 18 will be described with reference to FIGS. 19A to 19E.

Figure 19A:
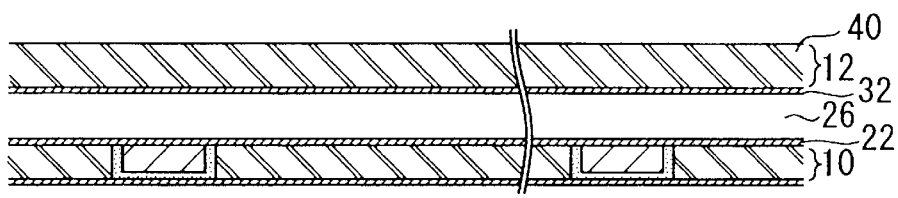
FIGS. 19A to 19E are sectional views for describing a method for manufacturing the multilayer interconnection structure shown in FIG. 18.
Figure 19B:
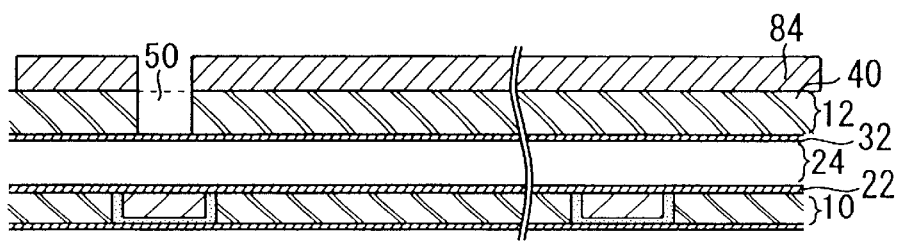
Figure 19C:
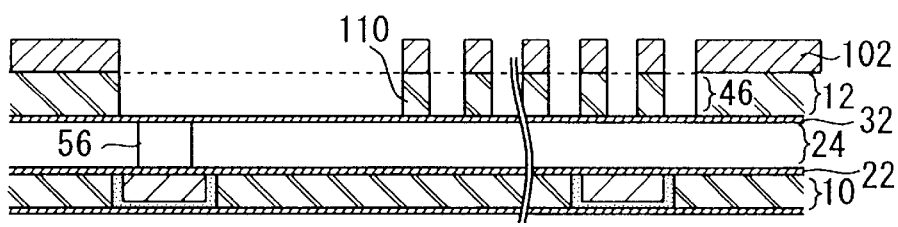

In the manufacturing method in this embodiment, the same procedure as that in the sixth embodiment is repeated until a contact hole 56 and a recess 46 are formed (see FIGS. 19A to 19C). In this embodiment, at that time, dummies 110 (equivalent to the patterned silicon nitride 104 in the sixth embodiment) are already formed.

Figure 19D:
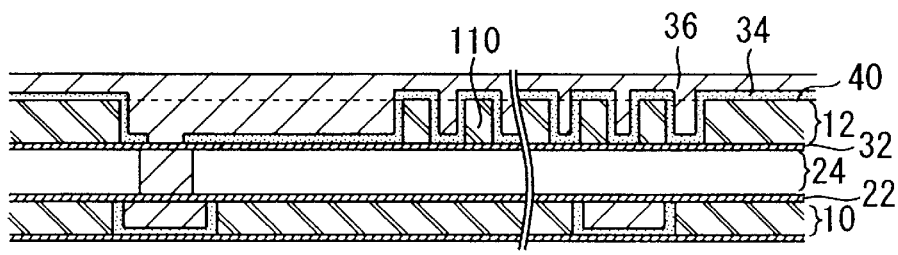

Referring to FIG. 19D, after removal of a resist film 102, a barrier metal 34 and a metal film 36 are formed in such a manner as to cover the interiors of the contact hole 56 and the recess 46 and to cover the surface of the insulating film 40.

Figure 19E:
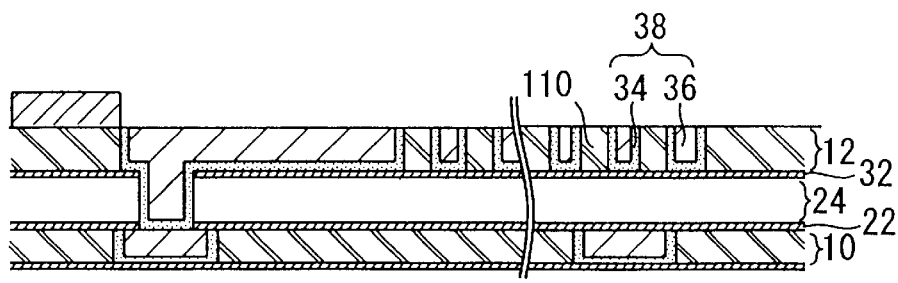

Referring to FIG. 19E, unnecessary portions of the barrier metal 34 and the metal film 36 (portion protruded from the recess 46 of an N-th interconnection layer 12) are removed by CMP. As a result, the interconnection structure shown in FIG. 18 is realized. After that, by repeating the same procedure as that described above, (N+1)-th and later interconnection layers can be formed.

In the structure in which the dummies 110 are formed in the interconnection 38, the surface portion of the interconnection 38 becomes hard to be removed by CMP as compared with in the structure in which the dummies 110 are not formed. As a result, according to the manufacturing method in this embodiment, it is possible to suppress the degree of the depression of the pad portion 44 caused by the dishing and to further flatten the surface of the interconnection 38 as compared with the manufacturing method in the sixth embodiment, and hence to easily and accurately manufacture a semiconductor substrate having a multilayer interconnection structure.

The major benefits of the present invention described above are summarized as follows:

According to the first aspect of the present invention, an interconnection includes a single layer portion provided in an interconnection layer and a double layer portion formed on an insulating film. Since the double layer portion, which is taken as a portion being liable to cause the dishing at the step of forming the interconnection, has a film thickness larger than that of the single layer portion, it is possible to form the interconnection having a low resistance at all of the portions.

According to the second aspect of the present invention, since dummies are formed in an interconnection, it is possible to make small the depression formed in the interconnection by the dishing, and hence to suppress the resistance of the interconnection and to flatten the surface of the semiconductor device.

According to the third aspect of the present invention, since the dummies are provided in the double layer portion, it is possible to suppress the depression, particularly, formed in the double layer portion at a small value.

According to the fourth aspect of the present invention, since the height of the dummy is equal to the height of the interconnection, it is possible to flatten the surface of the interconnection layer.

According to the fifth aspect of the present, since the height of the dummy is lower than the height of the interconnection, it is possible to prevent the dummies from being exposed to the surface of the interconnection.

According to the sixth aspect of the present invention, since the dummies are uniformly provided in the interconnection, it is possible to obtain a desirable dishing resisting characteristic over the entire area of the interconnection.

According to the seventh aspect of the present invention, since the dummies are arranged on concentric, it is possible to change the dishing resisting characteristic of the interconnection concentrically. The depression caused by the dishing is apt to be large near the central portion of the interconnection and is apt to be small near the peripheral portion of the wiring portion. In other words, the probability of occurrence of the depression caused by the dishing varies concentrically. According to the present invention, since the dishing resisting characteristic can be set on the basis of the probability of occurrence thereof, it is possible to sufficiently suppress the depression of the interconnection at a small value.

According to the eighth aspect of the present invention, since the density of the dummies is set to become higher in the direction from the peripheral portion to the central portion of the interconnection, it is possible to obtain the dishing resisting characteristic corresponding to the probability of occurrence of the depression caused by the dishing in each region of the interconnection, and hence to suppress the depression caused by the dishing at a small value over the entire area of the interconnection.

According to the ninth aspect of the present, since each of the dummies is arranged in every region divided by boundary lines extending in a grid patter, it is possible to give a desired dishing resisting characteristic to each region of the interconnection.

According to the tenth aspect of the present invention, since the occupancy of the dummies is set to become higher in the direction from the peripheral portion to the central portion of the interconnection, it is possible to obtain the dishing resisting characteristic corresponding to the probability of occurrence of the depression caused by the dishing in each region of the interconnection, and hence to suppress the depression caused by the dishing at a small value over the entire area of the interconnection.

According to the eleventh aspect of the present invention, since the dummies are radially arranged, the density of the dummies is high near the central portion of the interconnection and is low near the peripheral portion of the interconnection. Accordingly, it is possible to suppress the depression caused by the dishing at a small value over the entire area of the interconnection.

According to the twelfth aspect of the present invention, it is possible to form an interconnection having a single layer portion containing in an interconnection layer and a double layer portion contained in both the interconnection layer and an interlayer film layer. Accordingly, it is possible to realize the interconnection having a low resistance irrespective of the depression caused by the dishing.

According to the thirteenth aspect of the present invention, since the interconnection is formed after dummies are provided in a recess for containing the interconnection, it is possible to easily dispose the dummies in the interconnection.

Further, the present invention is not limited to these embodiments, but variations and modifications may be made without departing from the scope of the present invention.

The entire disclosure of Japanese Patent Application No. Hei 11-214361 filed on Jul. 28, 1999 including specification, claims, drawings and summary are incorporated herein by reference in its entirety.

What is claimed is:

1. A semiconductor device including an interconnection having a Damascene structure, comprising:
an interconnection layer formed on an interlayer film layer; and
an interconnection having a single layer portion contained in a recess formed in said interconnection layer and a double layer portion contained in a recess formed in both said interconnection layer and said interlayer film layer;
wherein all area of said double layer portion is formed on an insulating film.

2. The semiconductor device according to claim 1, further comprising:
a plurality of dummies made from an insulating material, said dummies being formed in said interconnection;
wherein each of said dummies is a projection which has a specific height and extends from the bottom surface to the top surface of said interconnection.

3. The semiconductor device according to claim 2, wherein said plurality of dummies are provided in said double layer portion.

4. A semiconductor device including an interconnection having a Damascene structure, comprising:
an interconnection contained in a recess formed in an interconnection layer; and
a plurality of dummies made from an insulating material, said dummies being formed in said interconnection;
wherein each of said dummies is a projection which has a specific height and extends from the bottom surface to the top surface of said interconnection.

5. The semiconductor device according to claim 4, wherein said specific height of said dummy is equal to the thickness of said interconnection.

6. The semiconductor device according to claim 4, wherein said specific height of said dummy is smaller than the thickness of said interconnection.

7. The semiconductor device according to claim 4, wherein said dummies are arranged with a uniform density in said interconnection.

8. The semiconductor device according to claim 4, wherein said dummies provided in said interconnection are arranged on concentric circles.

9. The semiconductor device according to claim 8, wherein the density of said dummies arranged on said concentric circles becomes higher in accordance with the arrangement order of said concentric circles from the outermost one to the central one.

10. The semiconductor device according to claim 4, wherein each of said dummies is arranged in every region divided by boundary lines extending in a grid pattern.

11. The semiconductor device according to claim 10, wherein the occupancy of said dummies in each of said regions is set to be high in said region positioned at the central portion of said interconnection and low in said region positioned at the peripheral portion of said interconnection.

12. The semiconductor device according to claim 4, wherein said dummies are arranged radially from the central portion of said interconnection.

13. A semiconductor device including an interconnection having a Damascene structure, comprising:
an interconnection layer formed on an interlayer film layer;
an interconnection having a single layer portion contained in a recess formed in said interconnection layer and a double layer portion contained in a recess formed in both said interconnection layer and said interlayer film layer; and
a plurality of dummies made from an insulating material, said dummies being formed in said interconnection;
wherein said double layer portion is formed on an insulating film; and
wherein each of said dummies is a projection which has a specific height and extends from the bottom surface to the top surface of said interconnection.

14. The semiconductor device according to claim 13, wherein said plurality of dummies are provided in said double layer portion.

15. The semiconductor device according to claim 13, wherein said specific height of said dummy is equal to the thickness of said interconnection.

16. The semiconductor device according to claim 13, wherein said specific height of said dummy is smaller than the thickness of said interconnection.

17. The semiconductor device according to claim 13, wherein said dummies are arranged with a uniform density in said interconnection.

18. The semiconductor device according to claim 13, wherein said dummies provided in said interconnection are arranged on concentric circles.

19. The semiconductor device according to claim 18, wherein the density of said dummies arranged on said concentric circles becomes higher in accordance with the arrangement order of said concentric circles from the outermost one of the central one.

20. The semiconductor device according to claim 13, wherein each of said dummies is arranged in every region divided by boundary lines extending in a grid pattern.

21. The semiconductor device according to claim 20, wherein the occupancy of said dummies in each of said regions is set to be high in said region positioned at the central portion of said interconnection and low in said region positioned at the peripheral portion of said interconnection.

22. The semiconductor device according to claim 13, wherein said dummies are arranged radially from the central portion of said interconnection.

* * * * *